(12) United States Patent
Graefe et al.

(10) Patent No.: US 7,723,169 B2
(45) Date of Patent: May 25, 2010

(54) LASER BEAM MICRO-SMOOTHING

(75) Inventors: Holger Graefe, Goettingen (DE); Uwe Wiedenbruch, Worbis (DE); Thomas Schroeder, Goettingen (DE); Frank Simon, Goettingen (DE); Elko Bergmann, Goettingen (DE)

(73) Assignee: Coherent, Inc., Santa Clara, CA (US)

( * ) Notice: Subject to any disclaimer, the term of this patent is extended or adjusted under 35 U.S.C. 154(b) by 439 days.

(21) Appl. No.: 11/709,041

(22) Filed: Feb. 21, 2007

(65) Prior Publication Data

US 2007/0196967 A1 Aug. 23, 2007

Related U.S. Application Data

(60) Provisional application No. 60/775,459, filed on Feb. 22, 2006, provisional application No. 60/857,287, filed on Nov. 7, 2006.

(51) Int. Cl.
*H01L 21/84* (2006.01)

(52) U.S. Cl. ............... 438/166; 438/795; 438/E21.561

(58) Field of Classification Search ............ 438/7, 438/151–166, 308, 795; 257/E21.561
See application file for complete search history.

(56) References Cited

U.S. PATENT DOCUMENTS

| 5,484,980 A | 1/1996 | Pratt et al. ............. 219/121.65 |
| 7,022,558 B2 | 4/2006 | Sato et al. ................... 438/150 |
| 2005/0139582 A1* | 6/2005 | Tanaka .................. 219/121.75 |
| 2005/0237895 A1 | 10/2005 | Tanaka et al. ................. 369/97 |
| 2005/0255716 A1 | 11/2005 | Tanaka et al. ............... 438/795 |

* cited by examiner

*Primary Examiner*—Richard A. Booth
(74) *Attorney, Agent, or Firm*—Morrison & Foerster LLP

(57) ABSTRACT

The present invention provides laser beam micro-smoothing for laser annealing systems. Laser beam micro-smoothing comprises shifting a laser beam in the direction perpendicular to the scanning direction (y) of a laser annealing system, while holding the laser beam fixed in the direction of scanning (x). The shifting may be accomplished, for example, with a pair of micro-smoothing mirrors. The shifting smoothes out small-scale inhomogeneities in the profile of the laser beam and prevents microscopic stripes associated with prior art laser annealing systems. Because the shifting occurs only in the direction perpendicular to the scanning direction (y), the laser annealing process in not adversely affected.

6 Claims, 3 Drawing Sheets

LASER BEAM MICRO-SMOOTHING

PRIORITY CLAIM

This application claims priority to U.S. Provisional Patent Application No. 60/775,459, filed on Feb. 22, 2006, and U.S. Provisional Patent Application No. 60/857,287, filed on Nov. 7, 2006, both of which are incorporated by reference herein.

FIELD OF THE INVENTION

The present invention relates generally to laser beam homogenization, and more specifically to smoothing out effects caused by small-scale inhomogeneities in laser beams of laser annealing systems.

BACKGROUND OF THE INVENTION

Laser annealing systems are utilized in the production of advanced display technologies such as liquid crystal displays (LCDs) and organic light-emitting diodes (OLEDs). One of the challenges associated with laser annealing is that the illumination field of a laser beam generally has a profile that includes inhomogeneities. Such inhomogeneities can have various causes including, for example, local defects like absorption or scattering centers in optical components, modulations in the raw laser beam and interference or diffraction from beam homogenizer arrays.

FIG. 1 illustrates a prior art laser annealing system 10. The system 10 includes a cylindrical lens (not shown) for focusing a laser beam 16, such as an excimer laser beam, onto the surface of an a-silicon-coated substrate 12. The illumination field 14 of the laser beam 16 typically has dimensions up to 470 mm (y-direction) by 0.4 mm (x-direction). This elongated beam spot is often referred to as a line focus.

The system 10 processes a substrate by scanning a single track in the x-direction and then, if the substrate's dimension in y-direction is longer than the corresponding dimension of the illumination field of the laser beam 16, shifting in the y-direction to scan a subsequent track.

In a typical system, the substrate is carried past the beam spot in the x-direction by a highly accurate translation stage. The scan velocity of the stage is on the order of six millimeters per second. Assuming a laser pulse repetition rate of 300 Hertz, the substrate will move about 20 microns in the x-direction between shots. This means that about 15 to 20 pulses (with an overlap of about 95%) will hit the substrate at each position.

FIG. 2 illustrates a magnified view of part of a substrate 20 that has been treated with the prior art laser annealing system of FIG. 1. As can be seen in FIG. 2, inhomogeneities in a laser beam across the long axis can manifest themselves as parallel lines or stripes running in the x-direction, which is the scanning direction of the laser beam. Width w represents a typical size of inhomogeneities in the illumination field of a laser beam, and the width of the illumination field is much larger than w.

Conventional beam homogenization techniques have focused on improving the homogeneity of the laser beam. Some prior art systems use diffusers in the laser beam path to improve the homogeneity of the laser beam. Other prior art systems have used light tunnels, lenses, lens arrays diffractive optical elements (DOE) or holographs to improve homogeneity. Prior art homogenization techniques cannot, however, remove all small-scale inhomogeneities. As a result, stripes such as those illustrated in FIG. 2 still occur. To address small-scale inhomogeneities, some prior art systems have used rotating wedges to move the laser beam in a circular motion on the object being scanned. Such systems tend to average out small-scale inhomogeneities, but these systems are not suitable for use with laser annealing systems.

SUMMARY OF THE INVENTION

Methods, apparatuses and systems consistent with the present invention provide laser beam micro-smoothing for laser annealing systems. Laser beam micro-smoothing comprises shifting a laser beam in the direction perpendicular to the scanning direction of the laser annealing system, while holding the laser beam substantially fixed in the scanning direction. This shifting of the laser beam in the direction perpendicular to the scanning direction smoothes out small-scale inhomogeneities in the profile of the laser beam and prevents stripes associated with prior art laser annealing systems.

In one aspect of the present invention, an apparatus is provided for laser beam micro-smoothing, which is configured for use with a laser annealing system. The laser annealing system scans a substrate in a scanning direction by applying a series of laser beam pulses to contiguous positions on a surface of the substrate. A means is included for moving a line focus of the laser beam on the surface of the substrate in a direction substantially perpendicular to the scanning direction by a predetermined distance between individual pulses of the series of pulses.

In another aspect of the present invention, a method is provided for laser beam micro-smoothing. The method comprises the steps of (a) positioning a line focus of the laser beam at a first position on a surface of a work piece; (b) processing the first position of the work piece with the laser beam by applying a plurality of laser beam pulses to the first position; and (c) during the processing of the first position, shifting the laser beam in the y-direction between the application of said pulses by a predetermined distance.

In another aspect of the present invention, a laser annealing system is provided. The laser annealing system includes a laser for generating a laser beam for scanning a substrate in a scanning direction by applying a series of laser beam pulses to contiguous positions on a surface of the substrate. The laser annealing system also includes means for moving a line focus of the laser beam on the surface of the substrate in a direction substantially perpendicular to the scanning direction by a predetermined distance between individual pulses of the series of pulses.

DETAILED DESCRIPTION

Throughout this document, the following terms shall have the following meanings:

"x-direction" shall refer to the scanning direction of a laser annealing system;

"y-direction" shall refer to the direction substantially perpendicular to the x-direction.

Figure 1:
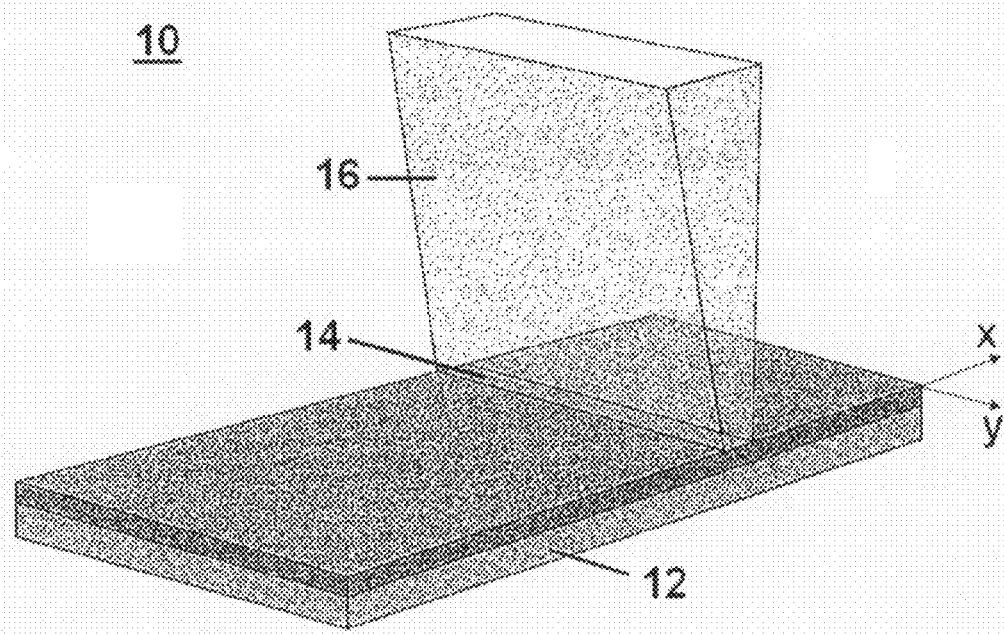
FIG. 1 illustrates a prior art laser annealing system.
Figure 2:
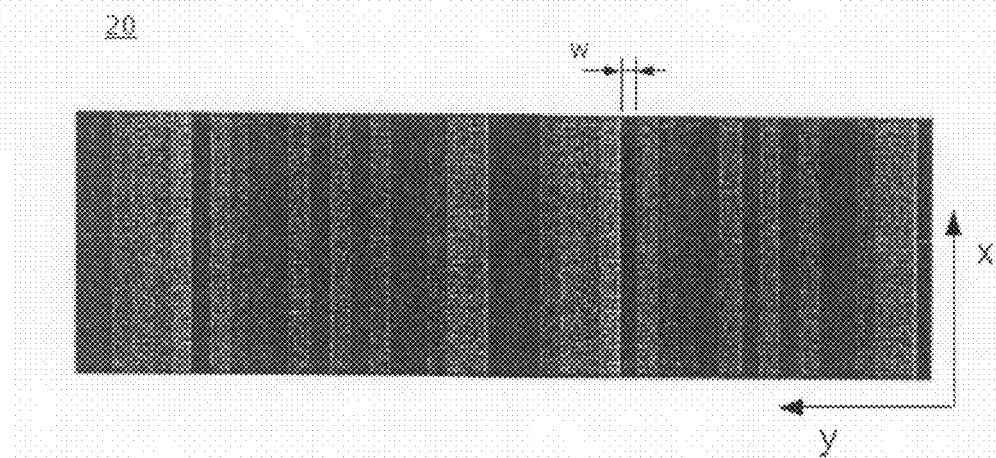
FIG. 2 illustrates a substrate processed by the prior art laser annealing system of FIG. 1.
Figure 3:
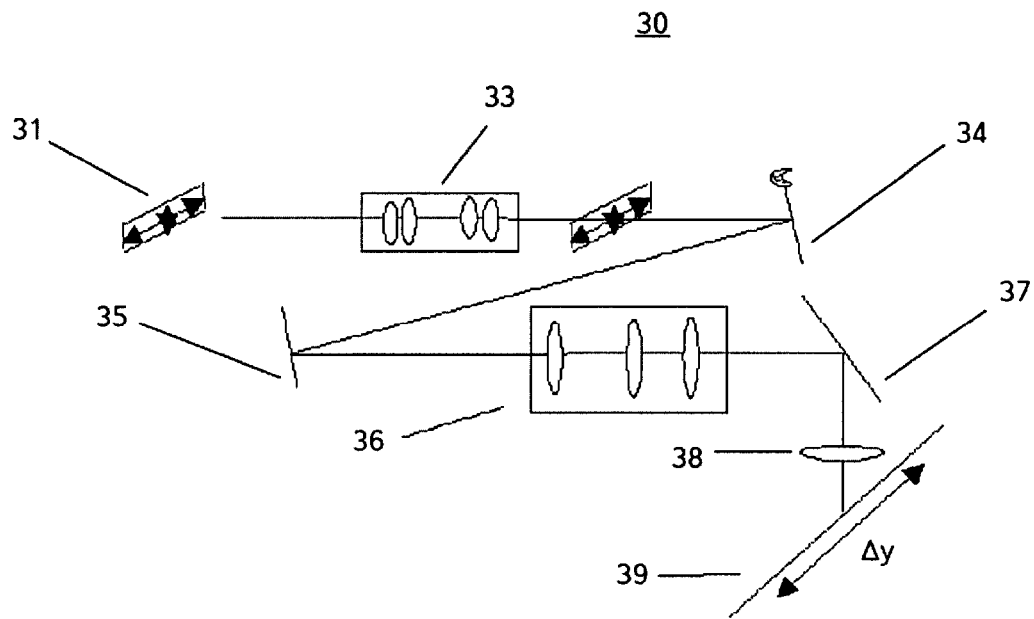
FIG. 3 illustrates a first embodiment of an apparatus for laser beam micro-smoothing consistent with the present invention.

FIG. 3 illustrates a first exemplary embodiment of an apparatus for laser beam micro-smoothing 30 consistent with the present invention. In the apparatus for laser beam micro-smoothing 30, a laser beam 31, such as an excimer laser beam or a YAG laser beam, with a substantially rectangular profile is directed through beam homogenizer optic system 33 to a micro-smoothing mirror 34. As homogenizer optic systems are well known in the homogenization art, no further description thereof is presented herein. The micro-smoothing mirror 34 includes an actuator, such as a piezoelectric actuator. Other actuators that are consistent with the present invention include motors with eccentric coupling and magnet-driven levers. In the case of the piezoelectric actuator, the actuator is positioned at one end of the micro-smoothing mirror and the other end of the micro-smoothing mirror may be attached to sheet metal to dampen vibrations. The actuator elongates by approximately +/−100 micrometers to tilt the micro-smoothing mirror such that the laser beam is shifted in the y-direction and not in the x-direction. For the annealing process, it is highly preferable that the laser beam be shifted only in a direction perpendicular to the scanning direction and not in the scanning direction. Of course, mechanical tolerances may result in some minor beam shift in the scanning direction but it is preferable to minimize any shifts in this direction.

As a result the shifting of the laser beam path, the line of focus of the laser annealing system is moved on the substrate plane in the y-direction. It is believed that the beam movement in the y-axis should be in the range of 0.5 mm to 10 mm and more preferably between 2 and 5 mm. As an example, the shift can be set to approximately +/−3 mm in the y-direction. In this example, the illumination field of the laser beam elongates due to the tilting of the micro-smoothing mirror by approximately 3 mm in the positive y-direction and approximately 3 mm in the negative y-direction. This movement in the y-direction tends to wash out or average out the inhomogeneities in the y-direction without altering the laser beam profile in the x-direction.

In one preferred approach, the movement of the micro-smoothing mirror is sinusoidal with a frequency of approximately a fifteenth to a tenth of the laser beam's pulse repetition frequency. An exemplary frequency is 20 Hertz for a laser system having a laser pulse repetition frequency of 300 Hertz. Additional mirrors 35, 37 and beam shaping optics 36 and a lens 38 may then direct the shifted laser beam to the surface of the work piece 39. Each contiguous position on the substrate is typically processed with approximately 10 to 20 laser pulses.

Other movement besides a sinusoidal pattern may be used. For example, a triangular signal can be applied to the piezoelectric element. In addition, it would also be effective to randomly move the mirror. Random movement could conceivably improve the smoothing effect however random movement is mechanically more difficult to implement.

Figure 4:
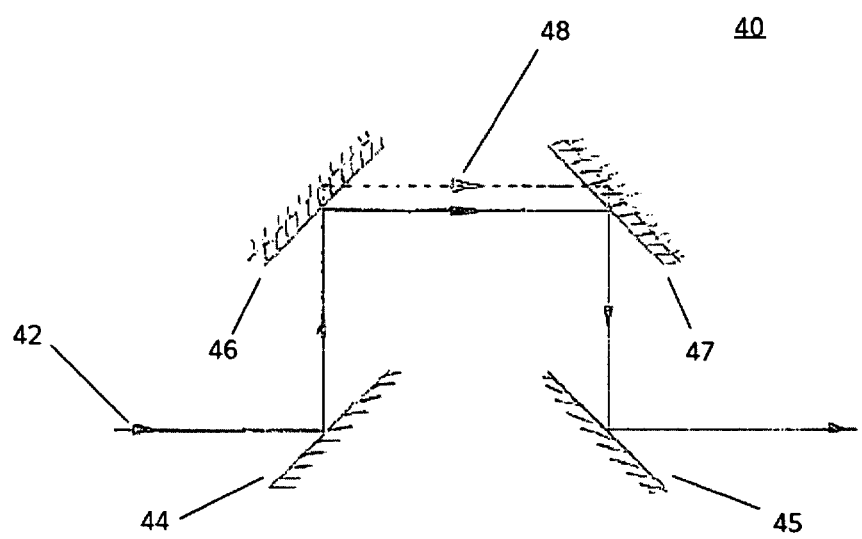
FIG. 4 illustrates a second embodiment of an apparatus for laser beam micro-smoothing consistent with the present invention.

FIG. 4 illustrates a second exemplary embodiment of an apparatus for laser beam micro-smoothing 40 consistent with the present invention. In this embodiment, four mirrors 44, 45, 46, 47 direct the laser beam around an open rectangle. This enables the apparatus for laser beam micro-smoothing 40 to be placed directly into the path of an existing laser beam with maximum flexibility. As illustrated in the figure, a laser beam 42, such as an excimer laser beam or a YAG laser beam, is directed to a first mirror 44, which deflects the laser beam 42 to first and second micro-smoothing mirrors 46, 47. The first and second micro-smoothing mirrors 46, 47 include actuators, such as piezoelectric actuators. The actuators are configured to elongate by approximately +/−50 micrometers in order to tilt the micro-smoothing mirror and shift the laser beam in the y-direction, but not in the x-direction. In between the application of each laser beam pulse, the line of focus of the laser beam is shifted in the y-direction by a predetermined distance. An example of shifting consistent with the present invention is a cyclical movement with an amplitude of +/−3 mm at a frequency of 20 Hertz. For example, during one period of the actuator, 15 pulses of the laser beam may be shot so that each of the 15 shots has a slightly different position in the y-direction, thus blurring the stripes caused by small-scale inhomogeneities.

The solid line 42 in FIG. 4 represents an un-shifted laser beam, and the dotted line 48 represents a shifted laser beam. As with the first embodiment, the movement of the laser beam in the y-direction tends to wash or average out small-scale inhomogeneities in the y-direction, without altering the laser beam profile in the x-direction. The second embodiment illustrated in FIG. 4 improves upon the first embodiment by minimizing vibrations caused by movement of the micro-smoothing mirror. This is accomplished by using two micro-smoothing mirrors with substantially equal masses. The acceleration forces of one micro-smoothing mirror compensate for the acceleration forces of the other micro-smoothing mirror.

Figure 5:
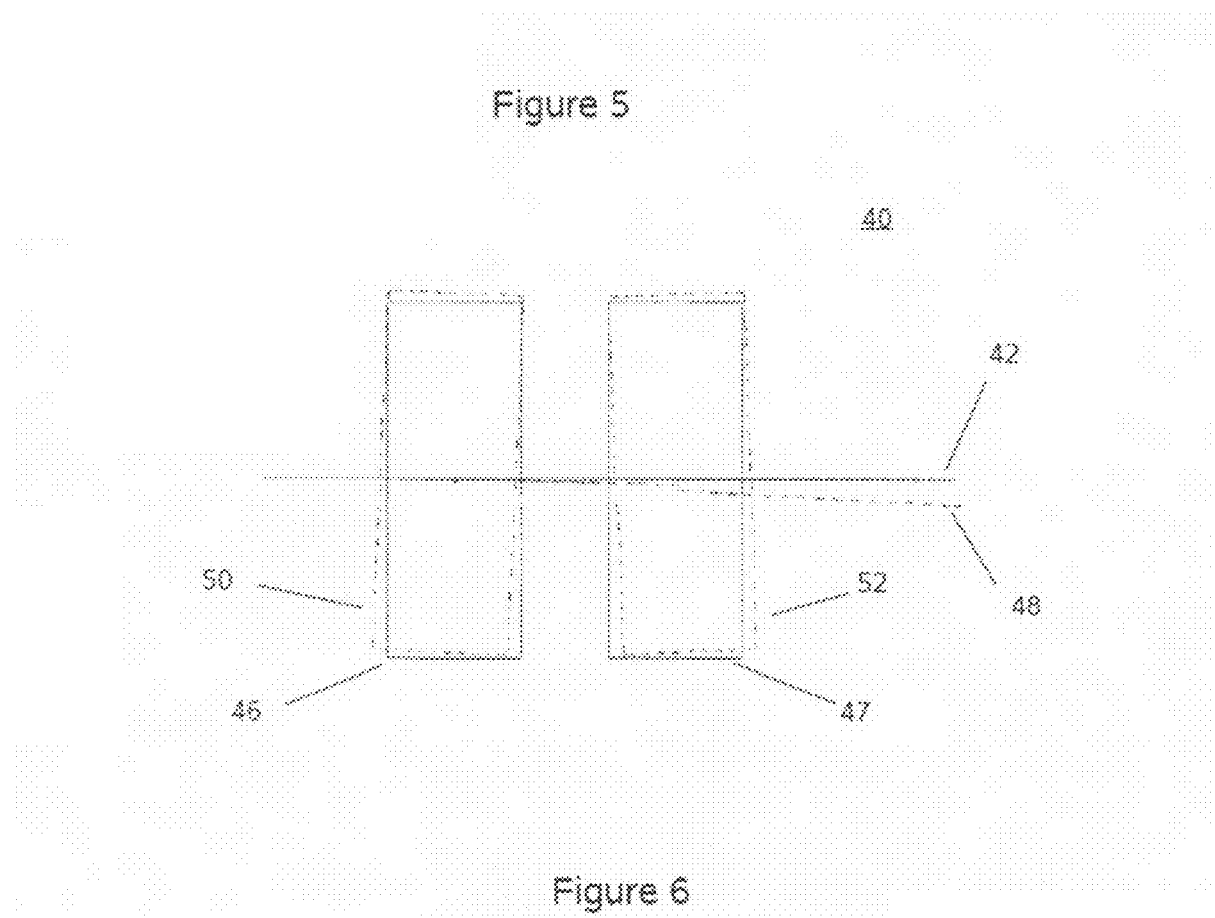
FIG. 5 illustrates an overhead view of the apparatus for laser beam micro-smoothing of FIG. 4.

FIG. 5 illustrates an overhead view of the apparatus for laser beam micro-smoothing 40 of FIG. 4. The solid lines represent the laser beam path 42 and the positions of the micro-smoothing mirrors 46, 47 without tilt. The dotted lines represent the shifted laser beam path 48 and the tilted positions 50, 52 of the micro-smoothing mirrors at maximum tilt. As can be seen in the figure, the micro-smoothing mirrors are moved in opposite directions. In this way, the acceleration forces associated with the movement of one micro-smoothing mirror compensate for or cancel out the acceleration forces of the other micro-smoothing mirror. This dual mirror configuration also minimizes movement of the laser beam path in the x-direction, which is undesirable for laser annealing systems.

Rotating wedge plates may also be utilized in place of micro-smoothing mirrors. However, in order to limit the movement of the laser beam path to only the y-direction, the wedge plates should be configured to rotate in opposite directions at the same frequency. If the starting point of the rotation is then appropriately selected, the laser beam path can be shifted in only the y-direction.

A rotating mirror, such as a polygonal mirror, may also be utilized in place of micro-smoothing mirrors. If the rotational speed of the rotating mirror is appropriately synchronized with the repetition rate of the laser beam system, the laser beam path can be shifted in only the y-direction with varying offsets for consecutive laser pulses. Other optical elements besides mirrors can be used to translate the beam.

Figure 6:
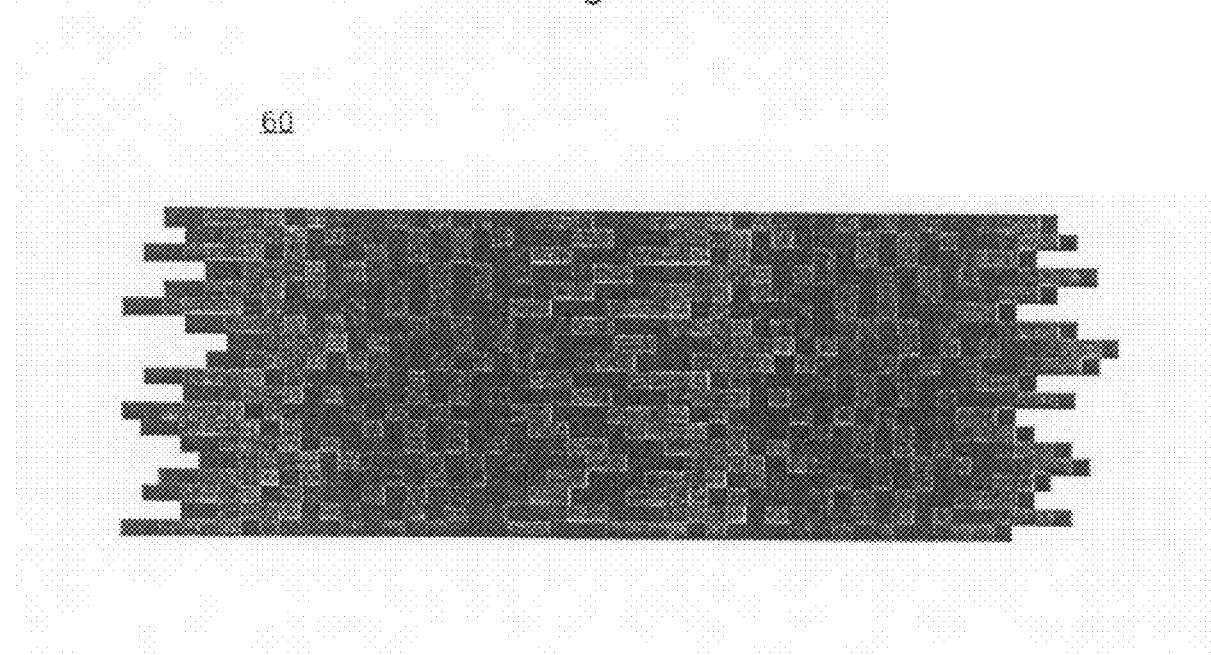
FIG. 6 illustrates a simulation of a substrate processed by a laser annealing system consistent with the present invention.

FIG. 6 illustrates a simulation of a magnified view of part of a substrate 60 that has been treated with a laser annealing system having an apparatus for laser beam micro-smoothing consistent with the present invention. The structures shown in FIG. 6 are barely visible by eye. The structures are depicted in the figure as squares solely for purposes of illustration. In reality, the structures have no simple geometric contours and no fixed dimensions. The dimensions of the structures are dependent upon the size of the inhomogeneities, the size of the elongation of the illumination field and the speed of movement of the substrate in the x-direction. As can be seen in the figure, small-scale inhomogeneities no longer manifest themselves as parallel lines or stripes running in the x-direction. The shifting of the laser beam is repeated for contiguous positions on the substrate and, if the substrate's width in the y-direction is longer than the corresponding width of the illumination field, for consecutive tracks of the substrate until the processing of the substrate is complete.

It should be recognized that a number of variations of the above-identified embodiments are within the scope of the invention. The invention should not be limited by the specific embodiments described herein. Rather, the scope of the invention is defined by the following claims and their equivalents.

What is claimed is:

1. A method for smoothing effects caused by inhomogeneities in a laser beam, comprising the steps of:
    positioning a line of focus of said laser beam at a first position on a surface of a work piece, with the long axis of the line focus being in the y-direction;
    processing said first position of said work piece with said laser beam by applying a plurality of laser beam pulses to said first position; and
    during said processing of said first position, shifting said laser beam in the y-direction only between the applications of said pulses by a predetermined distance.

2. The method of claim 1, wherein said step of shifting said laser beam comprises moving said laser beam between each of said laser beam pulses in the y-direction by a distance substantially equal to the average width of small-scale inhomogeneities of said laser beam.

3. The method of claim 1, wherein said step of shifting said laser beam comprises moving said laser beam in the y-direction in a substantially sinusoidal motion.

4. The method of claim 3, wherein the frequency of the sinusoidal motion is approximately a fifteenth to a tenth of said laser beam's pulse repetition frequency.

5. A method of treating a workpiece with a pulsed laser beam, said beam having a beam spot with an elongated footprint having a long axis and a short axis, said method comprising the steps of:
    (a) directing the beam to the workpiece;
    (b) dithering the beam in a first direction only, said first direction being parallel to the long axis of the beam spot to cause multiple pulses to impinge upon the workpiece at different positions;
    (c) translating the workpiece with respect to the beam spot in a second direction perpendicular to the long axis of the beam spot; and
    (d) repeating steps (b) and (c) to treat the workpiece in a manner to compensate for inhomogeneities in the long axis of the beam.

6. A method as recited in claim 5, wherein the workpiece is continuously translated with respect to the beam spot at a velocity such that a plurality of pulses overlap in the scanning direction.

* * * * *